（12） United States Patent
Bartoli et al.

(10) Patent No.: US 6,339,551 B1
(45) Date of Patent: Jan. 15, 2002

(54) SEMICONDUCTOR DEVICE WITH SELECTABLE PADS

(75) Inventors: Simone Bartoli, Cambiago; Mauro Sali, S. Angelo Lodigiano; Claudio Nava, Cornate d'Adda; Antonio Russo, Trezzo Sull'Adda, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/560,514

(22) Filed: Apr. 27, 2000

(30) Foreign Application Priority Data

Apr. 28, 1999 (EP) .............................................. 99830253

(51) Int. Cl.$^7$ ................................................. G11C 7/00
(52) U.S. Cl. ..................... 365/189.02; 365/49
(58) Field of Search .............................. 365/189.02, 49, 365/189.01

(56) References Cited

U.S. PATENT DOCUMENTS

| | | | |
|---|---|---|---|
| 5,732,207 A | 3/1998 | Allen et al. | ............ 395/182.03 |
| 5,825,235 A | 10/1998 | Oh | .............................. 327/408 |
| 5,951,678 A | * 9/1999 | Moyer | ......................... 712/237 |

\* cited by examiner

*Primary Examiner*—Hoai V. Ho
(74) *Attorney, Agent, or Firm*—Robert Iannucci; Seed IP Law Group, PLLC

(57) ABSTRACT

A semiconductor device includes at least two pads for the input of external signals and/or for the output of signals from said semiconductor device, at least two uncoupling buffers each connected to each one of said pads, at least one multiplexer connected to said pads by means of said uncoupling buffers and at least one memory element suitable to generate a configuration signal operating on said multiplexer and said uncoupling buffers to selectively enable one or the other of said pads.

11 Claims, 1 Drawing Sheet

SEMICONDUCTOR DEVICE WITH SELECTABLE PADS

TECHNICAL FIELD

The present invention refers to a semiconductor device that is preset with a configuration of pads that are selectable in relation to the user needs.

BACKGROUND OF THE INVENTION

The correct choice of the output pads and of the input pads has a fundamental importance in the design of a semiconductor device.

This is even more important primarily in the design of memory devices and especially of Flash memory devices. In industrial production, in fact, Flash memory devices must be realized in the most versatile way to guarantee a wide market range, so that they are not made uniquely for a single customer but instead for different customers. On the other hand, for a single Flash memory device there are different physical arrangements of the input and output pins in order to meet the requirements of the various customers.

A traditionally adopted technique for the configuration of input and output pads of the memory device consists in the utilization of different final steps of the process with corresponding different maskings. Such process steps are diversified according to the different configurations of the output and input pads that one wants to give the memory device. It is essential that the various cases are analyzed at a design stage so as to reduce the number of masks that are necessary.

Such a technique shows substantial costs of production that are tied to the differentiation of the process steps and therefore of the masks that are called for by the different configurations inherent in a same memory device.

SUMMARY OF THE INVENTION

In view of the state of the art described, an object of the present invention is to present a semiconductor device that is readily adjustable to the different pad configurations required by the users.

According to an embodiment of the present invention, such object is attained by a semiconductor device that comprises at least two pads for the input of external signals and/or for the output of signals from said semiconductor device, at least two uncoupling buffers each connected to each one of said pads, at least one multiplexer connected to said pads by means of said uncoupling buffers and at least one memory element suitable to generate a configuration signal operating on said multiplexer and said uncoupling buffers to selectively enable one or the other of said pads.

Owing to the present invention it is possible to realize a semiconductor device that allows to vary the configuration of the input and/or output pads and that minimizes the production costs of the device.

BRIEF DESCRIPTION OF THE DRAWING

The characteristics and the advantages of the present invention will become evident from the following detailed description of an embodiment thereof, that is illustrated as a non limiting example in enclosed drawing, in which.

DETAILED DESCRIPTION OF THE INVENTION

Figure 1:
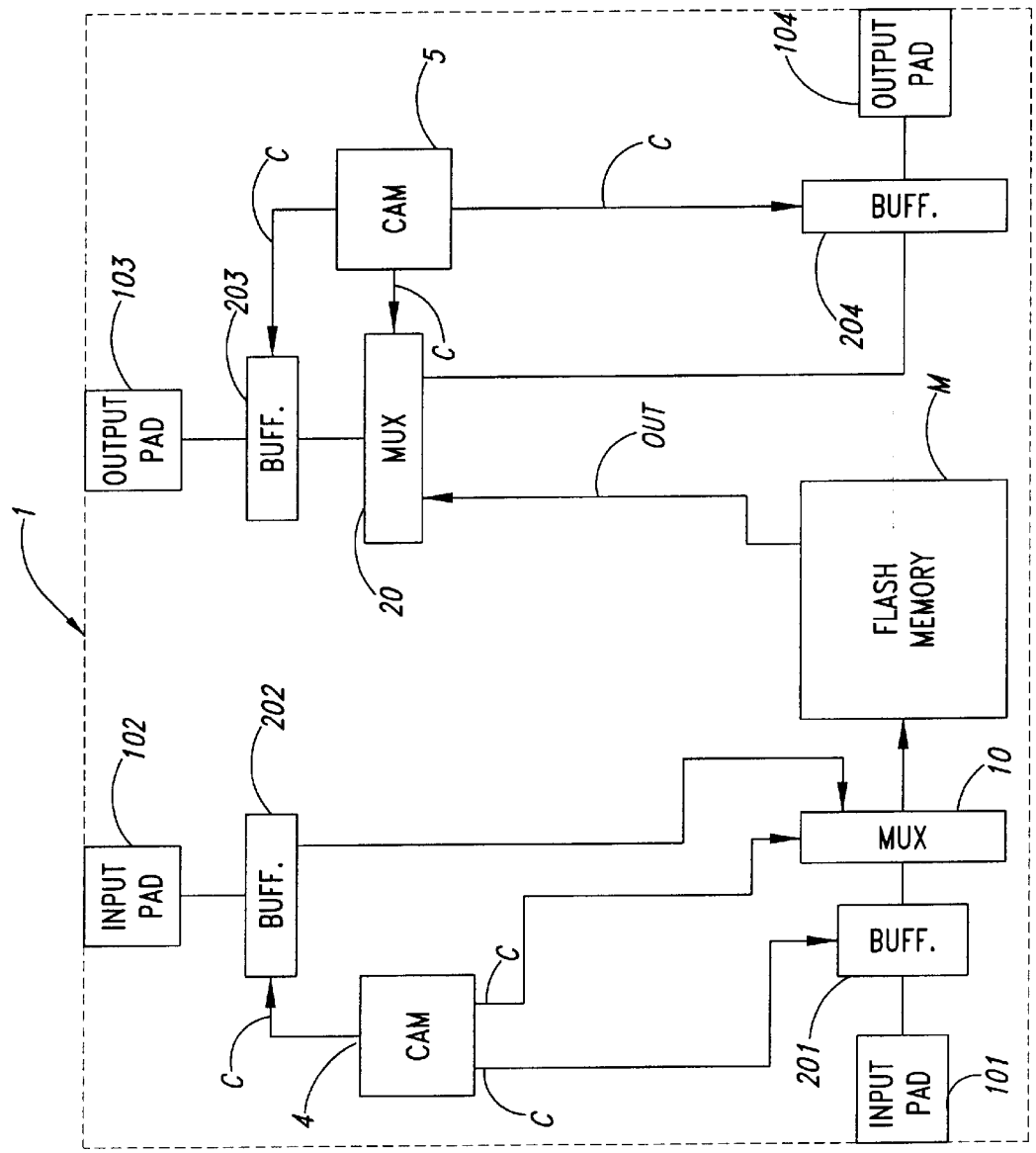
FIG. 1 is a schematic view of a Flash memory element according to an embodiment of the present invention.

With reference to FIG. 1, there is shown a schematic view of a semiconductor device 1 according to the present invention. Said device comprises in it a Flash memory element M, two multiplexers 10, 20, two CAM (Content Addressable Memory) memory elements 4, 5, four buffers 201, 202, 203, 204, two input pads 101, 102 and two output pads 103, 104.

An output signal OUT of the Flash memory M and the output signal C of the CAM memory 5 represent the input signals of the multiplexer 20. More precisely the output signal C of the CAM memory 5 represents a configuration bit that allows the multiplexer 20 to enable one or the other of the two pads 103, 104. In this way the output signal of the Flash memory is present only on one of the two pads 103, 104, thus obviating the problem of the differentiation of the processes and therefore of the masks according to the traditional technique. The pad 103 and the pad 104 are connected to the multiplexer 20 by means of buffers 203, 204, respectively buffer 203 for pad 103 and buffer 204 for pad 104. Such buffers 203, 204 serve to uncouple the multiplexer 20 from the output pads since the capacity of the pads is much higher that the capacity of the output terminal of the multiplexer. In input the buffers 203 and 204 also are provided with the same signal C coming from the CAM memory 5, which allows to disable one of the two pads, leaving the other one on, thus preventing a high consumption of the current coming from the power supply. The pad enabling and disabling operations are made after the "testing" stage of the product.

According to the same FIG. 1, the same configuration provided for the output of data signals from the Flash memory M is provided for the input of the data signals coming from the outside. To this purpose the semiconductor device 1 is provided with a second multiplexer 10, with a second CAM memory 4, with two additional buffers 201, 202 and with two additional pads 101, 102. The multiplexer 10 enables one or the other of the two pads 101, 102, respectively connected to the buffer 201, 202, by means of the configuration bit C coming from the CAM memory 4. The input signal of the enabled pad will become the input signal IN of the Flash memory M. In addition, the configuration bit coming from the CAM memory 4 is sent to pads 101, 102 in order to disable the pad that is not in operation.

The embodiment shown in FIG. 1 allows the connections of the input and output pads 101–104 of the semiconductor device 1 to be established and/or changed at any time without changing any portions of the manufacturing process or of the masks employed to make the semiconductor device. One skilled in the semiconductor art could easily program the CAM memories 4, 5 to set the connections as desired. Such programming or reprogramming of the CAM memories 45 could occur before or after the semiconductor device 1 is put together or integrated within a more extensive semiconductor system.

Various modifications can be made to the embodiment shown in FIG. 1 without departing from the invention. For example, the CAM memories 4, 5 could be replaced with a controller, such as a microprocessor, that controls the multiplexers 10, 20 to configure in input/output pads 101–04 based on programmed instructions and/or user input. Accordingly, the invention is not limited except as by the following claims.

What is claimed is:

1. A semiconductor device, comprising:

two pads for the input of external signals or for the output of signals from said semiconductor device, said two pads being input or output terminals of a Flash memory;

two uncoupling buffers each connected to one of said pads, respectively;

a multiplexer connected to said pads through said uncoupling buffers; and a CAM (content addressable memory) suitable to generate a configuration signal operating on said multiplexer and said uncoupling buffers to selectively enable one or the other of said pads.

2. The semiconductor device according to claim 1, further comprising a memory device having an output connected to an input of the multiplexer, wherein the multiplexer is structured to pass an output signal from the output of the memory device to whichever pad is selectively enabled.

3. The semiconductor device according to claim 1, further comprising a memory device having an input connected to an output of the multiplexer, wherein the multiplexer is structured to pass an input signal from whichever pad is selectively enabled to the input of the memory device.

4. A semiconductor device, comprising:

first and second I/O pads for the input of external signals or for the output of signals from said semiconductor device;

a switching device connected to the I/O pads and having a control input;

a memory device coupled to the switching device; and a CAM (content addressable memory) element connected to the switching device and suitable to generate a configuration signal on the control input of the switching device to selectively connect one of the I/O pads to the memory device.

5. The semiconductor device of claim 4 wherein the memory device includes a Flash memory.

6. The semiconductor device of claim 4, wherein the memory device has an output connected to an input of the switching device, wherein the switching device is structured to pass an output signal from the output of the memory device to whichever I/O pad is selectively enabled.

7. The semiconductor device of claim 4, wherein the memory device has an input connected to an output of the switching device, wherein the switching device is structured to pass an input signal from whichever pad is selectively enabled to the input of the memory device.

8. The semiconductor device of claim 4 wherein the switching device is a multiplexer.

9. The semiconductor device of claim 4, further comprising first and second uncoupling buffers connected between the switching device and the first and second I/O pads, respectively, each of the uncoupling buffers being coupled to receive the configuration signal from the memory element in order to be selectively enabled by the memory element.

10. A method of transferring signals in a semiconductor system having a plurality of I/O pads, the method comprising:

electrically connecting a memory device to a switching element that is coupled to the plurality of I/O pads; and selectively controlling the switching element such that the switching element selectively electrically connects the semiconductor device with one of the I/O pads;

storing configuration information in a memory element wherein the memory element performs the selectively controlling step based on the configuration information; and wherein the memory element includes a content addressable memory.

11. The method of claim 10 wherein the memory device includes a Flash memory.

\* \* \* \* \*

UNITED STATES PATENT AND TRADEMARK OFFICE
CERTIFICATE OF CORRECTION

PATENT NO. : 6,339,551 B1
DATED : January 15, 2002
INVENTOR(S) : Simone Bartoli et al.

It is certified that error appears in the above-identified patent and that said Letters Patent is hereby corrected as shown below:

<u>Column 3,</u>
Line 25, "a CAM (content addressable memory) element connected" should read -- a CAM (content addressable memory) connected -- in the issued patent.

Signed and Sealed this

Fourteenth Day of May, 2002

Attest:

JAMES E. ROGAN
*Attesting Officer*    *Director of the United States Patent and Trademark Office*